(12) United States Patent
Sugiyama

(10) Patent No.: US 9,107,297 B2
(45) Date of Patent: Aug. 11, 2015

(54) CIRCUIT BOARD AND OPTICAL MODULATOR

(75) Inventor: Masaki Sugiyama, Sagamihara (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 13/462,043

(22) Filed: May 2, 2012

(65) Prior Publication Data

US 2013/0027762 A1    Jan. 31, 2013

(30) Foreign Application Priority Data

Jul. 29, 2011    (JP) .................. 2011-167726

(51) Int. Cl.
| G02F 1/03 | (2006.01) |
| G02F 1/07 | (2006.01) |
| H05K 1/02 | (2006.01) |
| H05K 1/11 | (2006.01) |
| H05K 3/36 | (2006.01) |

(52) U.S. Cl.
CPC .............. H05K 1/0215 (2013.01); H05K 1/112 (2013.01); H05K 3/363 (2013.01); H05K 2201/094 (2013.01)

(58) Field of Classification Search
CPC ......... G02F 1/01; G02F 1/0121; G02F 1/167; G02F 1/011; G02F 1/157; G02F 1/21; G02F 1/23; G02F 2201/44; H05K 1/028; H05K 2201/0969; H05K 1/025; H05K 1/147; H05K 1/117; H05K 2201/09263; H05K 1/00; H05K 2201/09336; H05K 2201/09

USPC .......... 359/247, 254, 237, 238, 245; 333/238, 333/246, 33, 260

See application file for complete search history.

(56) References Cited

U.S. PATENT DOCUMENTS

| 2006/0043562 A1 * | 3/2006 | Watanabe .................... 257/686 |
| 2007/0126524 A1 | 6/2007 | Yagisawa | |
| 2008/0180947 A1 * | 7/2008 | Jang et al. .................... 362/225 |

FOREIGN PATENT DOCUMENTS

| JP | 2003-249711 | 9/2003 |
| JP | 2007-158856 | 6/2007 |
| JP | 2007158856 A * | 6/2007 |

* cited by examiner

*Primary Examiner* — Thomas K Pham
*Assistant Examiner* — Sharrief Broome
(74) *Attorney, Agent, or Firm* — Staas & Halsey LLP

(57) ABSTRACT

A printed circuit board (PCB) has a connection ground pattern and a wiring ground pattern. The connection ground pattern is a pattern for soldered connection formed on a first wiring layer. The wiring ground pattern is formed to be spaced from the connection ground pattern on the first wiring layer. The connection ground pattern and the wiring ground pattern are electrically coupled via a second wiring layer. When the wiring ground pattern is covered with an insulating layer, such as a solder resist, even if the position of an end of the insulating layer varies among wiring ground patterns, an influence on an exposed area of the connection ground pattern is eliminated.

3 Claims, 5 Drawing Sheets

CIRCUIT BOARD AND OPTICAL MODULATOR

CROSS-REFERENCE TO RELATED APPLICATION

This application is based upon and claims the benefit of priority of the prior Japanese Patent Application No. 2011-167726, filed on Jul. 29, 2011, the entire contents of which are incorporated herein by reference.

FIELD

The embodiment discussed herein is directed to a circuit board and an optical modulator.

BACKGROUND

Conventionally, in circuit boards used in devices such as an optical modulator, patterning of an electrode just above an optical waveguide can be performed to use a change in refractive index caused by an electric field. Such circuit boards include a surface-mount technology (SMT)-based circuit board in which an electrode of another circuit board is directly soldered onto the surface of the board to facilitate mounting of a ground electrode and the like. If such an SMT circuit board has multiple channels of electric inputs, a plurality of ground patterns is formed on the surface of the board. Each of the ground patterns is coupled to another circuit board and serves to reduce crosstalk. Therefore, a ground electrode for connection (hereinafter, referred to as a "connection part") and a ground wiring for crosstalk reduction (hereinafter, referred to as a "non-connection part") are mounted on the circuit board.

Patent document 1: Japanese Laid-open Patent Publication No. 2003-249711
Patent document 2: Japanese Laid-open Patent Publication No. 2007-158856

On the surface of a circuit board, a non-connection part is covered with an insulating layer, such as a solder resist, to prevent a short circuit due to solder bridging. When the non-connection part is covered with the insulating layer, a part of a connection part can also be covered to completely cover the non-connection part. In this case, depending on the formation accuracy of the insulating layer, the position of an end of the insulating layer may vary in an extending direction of the non-connection part on the side of the connection part. This causes a variation in connection part area among connection parts in the same circuit board or different circuit boards. The variation in connection part area may adversely affect the reliability (the fatigue resistance, the connection strength) or electrical characteristics of each connection part when the connection part is coupled to an electrode of another circuit board. Therefore, the variation in connection part area in the circuit board is preferably small.

SUMMARY

According to an aspect of an embodiment of the invention, a circuit board includes a first pattern and a second pattern. The first pattern is a first pattern for soldered connection that is formed on a first wiring layer. The second pattern is a second pattern for wiring that is formed to be spaced from the first pattern on the first wiring layer, and is electrically coupled to the first pattern via a second wiring layer.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT

Preferred embodiments of the present invention will be explained with reference to accompanying drawings. Incidentally, the circuit board and the optical modulator according to the present invention are not limited by the embodiment below.

Figure 1A:
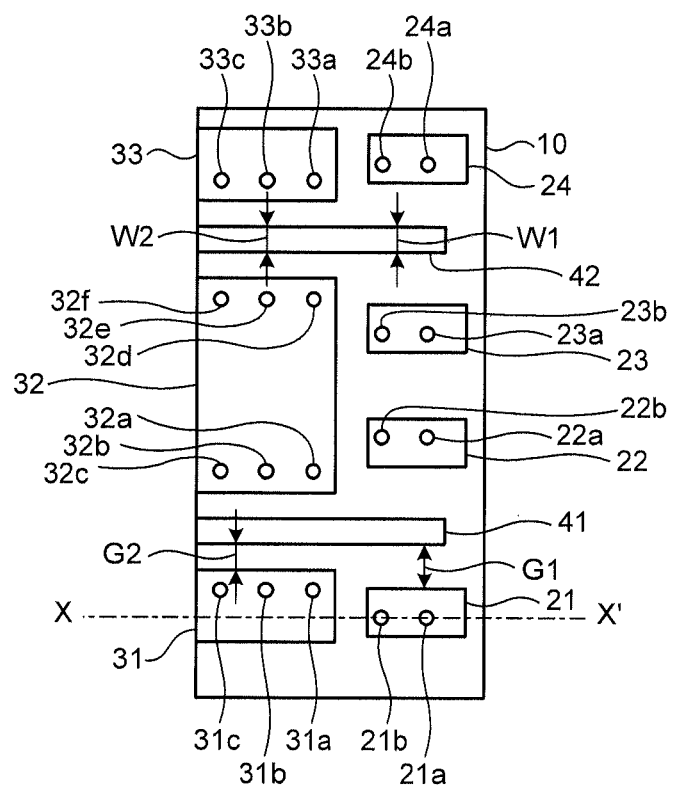
FIG. 1A is a plan view of a printed circuit board according to a present embodiment.

First, a configuration of a printed circuit board according to an embodiment of the present invention is explained. FIG. 1A is a diagram illustrating a configuration of a printed circuit board (PCB) 10 according to the present embodiment. As illustrated in FIG. 1A, the PCB 10 has ground patterns for grounding 21, 22, 23, 24, 31, 32, and 33 and signal patterns for signal transmission 41 and 42 parallel with the ground patterns on the surface thereof. The ground patterns further include the connection ground patterns 21 to 24 and the wiring ground patterns 31 to 33. The connection ground patterns 21 to 24 are island-like patterns (connection parts described above, ground electrodes) formed for soldered connection to a flexible printed circuit (FPC) 80 to be described below. The wiring ground patterns 31 to 33 are patterns (non-connection parts described above, ground wiring lines) formed for reduction of crosstalk on the PCB 10.

The connection ground pattern 21 and the wiring ground pattern 31 are formed to be opposed to each other on the side of an extending direction and to be placed spaced apart. In the same manner, the connection ground patterns 22 and 23 and the wiring ground pattern 32 are formed to be opposed to each other on the side of the extending direction and to be placed spaced apart; the connection ground pattern 24 and the wiring ground pattern 33 are formed to be opposed to each other on the side of the extending direction and to be placed spaced apart.

Figure 1B:
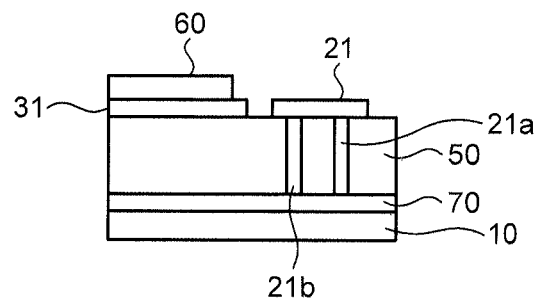
FIG. 1B is a cross-sectional view of the printed circuit board according to the present embodiment along a line X-X'.

FIG. 1B is a cross-sectional view of the PCB 10 according to the present embodiment along a line X-X'. As illustrated in FIG. 1B, the surface of the PCB 10 is covered with a solder resist 60 so that the connection ground pattern 21 and an end portion of the wiring ground pattern 31 on the side of the connection ground pattern 21 are exposed. The connection ground pattern 21 and the wiring ground pattern 31 are spatially separated on the surface of the PCB 10. Therefore, even if the position of an end of the solder resist 60 varies, an area of the connection ground pattern 21 is equal to respective areas of the other connection ground patterns 22 to 24, and the connection parts are uniform in area. Furthermore, the connection ground pattern 21 and the wiring ground pattern 31 are physically separated. Therefore, when the PCB 10 is coupled to the FPC 80 by soldering, it is possible to prevent solder from flowing into the wiring ground pattern 31 on the side of the line. As a result, even when the soldering is performed by hand, the work of soldering can be made easy, and high-density mounting on the surface of the board becomes possible.

Figure 2:
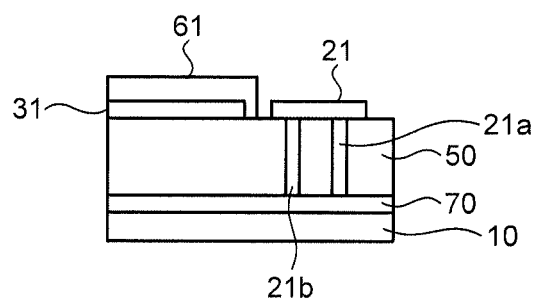
FIG. 2 is a cross-sectional view of a printed circuit board according to a modified example of the embodiment along the line X-X'.

FIG. 2 is a cross-sectional view of a PCB according to a modified example of the embodiment along the line X-X'. As illustrated in FIG. 2, the wiring ground pattern 31 can be completely covered with a solder resist 61. In this modified example, an end of the solder resist 61 is located between the wiring ground pattern 31 and the connection ground pattern 21. According to this modified example, the entire ground wiring is protected with an insulating layer, thereby preventing the occurrence of solder bridging more certainly. As a result, a short circuit is prevented from occurring, and the resistance and reliability of the PCB 10 in the manufacturing process are improved. In addition, even if the position of the end of the solder resist 61 varies within a space between the ground wiring and the ground electrode, respective areas of the connection ground patterns are maintained uniformly.

Incidentally, in the present embodiment, for reasons of an electrical characteristic of difficulty in impedance matching resulting in signal characteristic degradation, only the ground patterns 21 and 31 are separated and the signal pattern 41 is not separated as illustrated in FIG. 1A. However, as the width of the signal pattern 41 is smaller than those of the ground patterns 21 and 31, in the signal pattern 41, an amount of solder flowing into the wiring part from the connection part in the soldered connection to the FPC 80 is smaller than that is in the ground patterns 21 and 31. Furthermore, as the width of the signal pattern 41 is smaller than those of the ground patterns 21 and 31, radiation of heat in the soldering is small, and the connection part can be heated easily as compared with the ground patterns 21 and 31.

As described above, the signal pattern has the excellent solder-mountability, and solder can certainly and easily flow into the connection part without covering the wiring part with a solder resist unlike the ground pattern. Therefore, the signal pattern 41 does not necessarily have to be covered with a solder resist; in this case, the problem of the variation in connection part area due to a cover of the wiring part of the signal pattern 41 does not arise. As a result, even if the signal pattern 41 is not separated on the surface of the board, a problem in mounting does not arise, and it is possible to achieve the effect of the present embodiment, i.e., possible to suppress the variation in connection part area on the surface of the board.

Furthermore, as illustrated in FIGS. 1B and 2, the connection ground pattern 21 and the wiring ground pattern 31 are coupled to an intermediate layer 70 via through-holes 21a, 21b, 31a, 31b, and 31c; however, the signal patterns 41 and 42 are not coupled to the intermediate layer 70. A layer-to-layer connection of a signal line made by the signal pattern causes non-uniformity in thickness of the signal line or discontinuity between GSG (ground-signal-ground). Therefore, especially in the operation of the PCB 10 according to the present embodiment in an assumed high-frequency band (of about tens of gigahertz), impedance matching is difficult. As a result, the effect of crosstalk reduction achieved by the ground patterns is impaired. Therefore, in the PCB 10 according to the present embodiment, connection between the surface of the board and the intermediate layer 70 is limited to the ground patterns only, and the signal patterns are formed exclusively on the surface of the board (without making a through-hole connecting to the intermediate layer 70). Accordingly, the PCB 10 can keep impedance at a constant value (for example, 50 ohms), and can suppress the reflection of an input signal.

On the surface of the PCB 10, the ground patterns 21 and 31 are formed so that a distance G1 between the connection ground pattern 21 and the signal pattern 41 is greater than a distance G2 between the wiring ground pattern 31 and the signal pattern 41. In the PCB 10, the connection ground pattern 21 and the wiring ground pattern 31 are spaced apart. Therefore, adjustment of the width can be made easily as compared with a case where the ground patterns 21 and 31 are integrally formed, and as a result, adjustment of the respective distances G1, G2 between the ground patterns 21, 31 and the signal pattern 41 can also be made easily. In the adjustment, as for the connection ground pattern 21, the relatively large distance G1 is set to place priority on the mountability; as for the wiring ground pattern 31, the relatively small distance G2 is set to place priority on reduction of crosstalk.

As illustrated in FIG. 1A, by setting the distances G1 and G2 to satisfy G1>G2, the width of the connection ground pattern 21 becomes relatively small. Accordingly, in the soldering, an amount of solder flowing into the side of the wiring part is reduced, and solder is more prone to flow on the lower side of the FPC 80. Furthermore, an amount of heat radiation in the soldering is also reduced, so the ground electrode can be easily heated, and the soldering efficiency is improved. As a result, solder bridging or the like is less likely to occur, and the ease of mounting is improved. Incidentally, when the distances G1 and G2 are set to satisfy G1>G2, the distance G1 between the connection ground pattern 21 and the signal pattern 41 is larger, so crosstalk is more likely to occur; however, an influence of the crosstalk is limited in extent because the signal pattern 41 on the side of the connection part is shorter than the signal pattern 41 on the side of the non-connection part (the wiring part).

On the other hand, by setting the distances G1 and G2 to satisfy G1>G2, the distance between the wiring ground pattern 31 and the signal pattern 41 is relatively smaller. This restricts the spread of an electric field from the signal pattern 41. Crosstalk is caused by the spread of an electric field, so crosstalk is sufficiently reduced by setting the small distance G2.

Figure 3A:
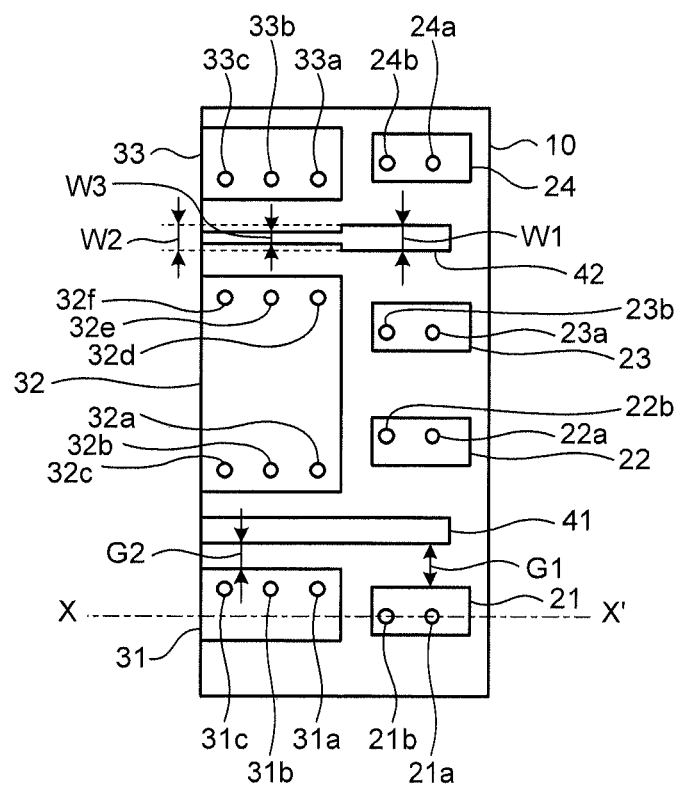
FIG. 3A is a plan view of the printed circuit board according to the modified example.

Incidentally, as characteristics of a waveguide, the small distance G2 makes a tendency as a coplanar line more prominent than a tendency as a microstrip line, so there is concern that impedance is decreased, thereby causing the reflection of an input signal. FIG. 3A is a plan view of the PCB according to the modified example. As illustrated in FIG. 3A, the width of the signal pattern 42 can differ between on the side of the ground electrode and on the side of the ground wiring. Namely, in FIG. 1A, the signal pattern 42 is formed so that widths W1 and W2 of the signal pattern 42 are the uniform width; however, in FIG. 3A, the signal pattern 42 is formed so that a portion of the signal pattern 42 parallel with the wiring ground pattern 33 has a width W3 smaller than the widths W1 and W2. As the width W3 is smaller than the width W1, even if the above-described distance G2 is small, the influence of the spread of an electric field from the signal pattern 42 on the impedance is mitigated, and a decrease in impedance is compensated. Accordingly, a decrease in impedance due to the small distance G2 is suppressed, and impedance is kept at a constant value (for example, 50 ohms). As a result, the reflection of an input signal is suppressed.

Figure 3B:
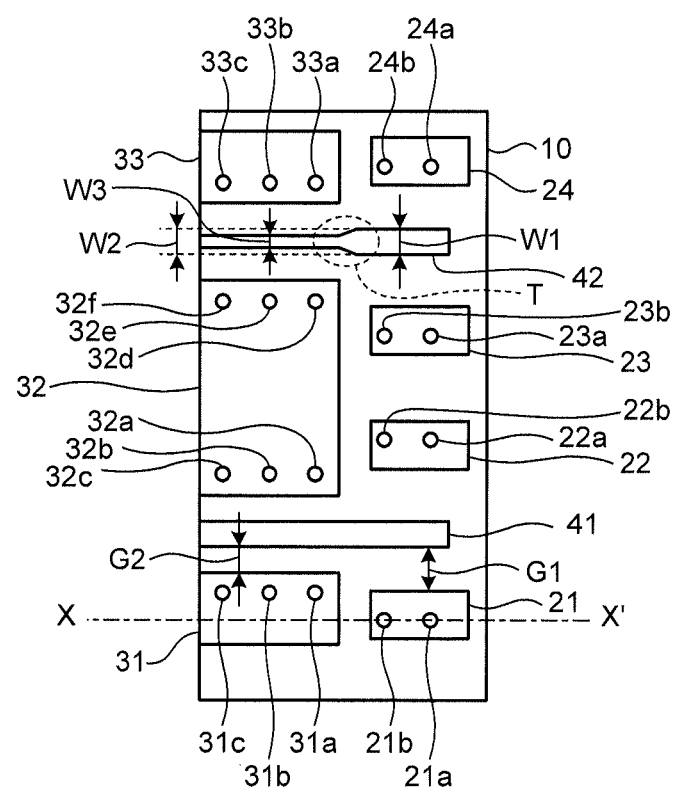
FIG. 3B is a plan view of a printed circuit board according to another modified example of the embodiment.

Furthermore, in the above modified example, the width of the signal pattern 42 changes from the width W1 to the width W3, so the formation accuracy of a pattern in this portion or the manufacturability of the PCB 10 may be decreased. FIG. 3B is a plan view of a PCB according to another modified example. When the width of the signal pattern 42 differs between on the side of the ground electrode and on the side of the ground wiring, a tapered portion T can be formed as illustrated in FIG. 3B. Namely, in FIG. 3A, the signal pattern 42 is formed so that the border between the ground electrode and the ground wiring where the width of the signal pattern 42 is narrowed down from the width W1 to the width W3 bends at an almost right angle. On the other hand, in FIG. 3B, a portion of the signal pattern 42 around the border between the ground electrode and the ground wiring is formed into a tapered shape so that the width of the signal pattern 42 is gradually narrowed down from the side of the ground electrode toward the side of the ground wiring. Accordingly, a change in the width of the signal pattern 42 is mitigated. Therefore, while suppressing the reflection of an input signal, degradation of the accuracy due to a sudden change in the pattern width and eventually a decrease in the manufacturability of the board can be prevented as much as possible. As a result, the reliability of the PCB 10 is improved.

Furthermore, a wiring ground pattern does not necessarily have to be formed so as to stand face to face with a connection ground pattern like the wiring ground patterns 31 and 33; alternatively, a plurality of wiring ground patterns can be integrated into one wiring ground pattern. Namely, as illustrated in FIGS. 1A, 3A, and 3B, unlike the wiring ground patterns 31 and 33, the wiring ground pattern 32 located between the adjacent signal patterns 41 and 42 on the PCB 10 is a wiring ground pattern into which a plurality of wiring ground patterns are integrated. The effect of crosstalk reduction is improved with the expansion of an area of a ground region adjacent to a signal pattern. Therefore, a plurality of wiring ground patterns are integrated into one, and the one wiring ground pattern is used for reduction of crosstalk of the both signal patterns 41 and 42 located on both sides of the wiring ground pattern, thereby an area of a ground region between the signal patterns 41 and 42 is increased, and the crosstalk can be reduced further.

Figure 4:
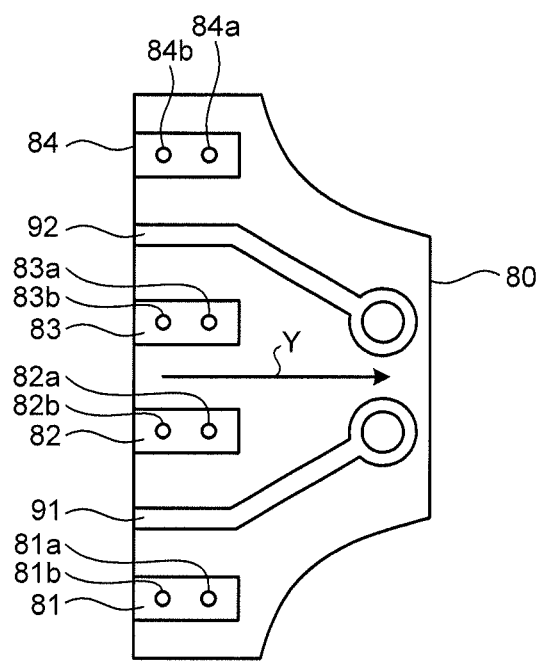
FIG. 4 is a rear view of a flexible printed circuit according to the present embodiment.

The surface of the PCB 10 is coupled to the backside of the FPC 80 via the connection ground patterns 21 to 24, ground patterns 81 to 84, the signal patterns 41 and 42, and signal patterns 91 and 92. FIG. 4 is a rear view of the FPC 80 according to the present embodiment. As illustrated in FIG. 4, the pitch between the two signal patterns 91 and 92 composing a channel in the FPC 80 becomes narrower toward a direction of signal transmission (a direction of an arrow Y in FIG. 4). Namely, a distance between the signal patterns formed on the FPC 80 is smaller than that is on the PCB 10. Accordingly, the packaging density in connection between the FPC 80 and a package is increased. Therefore, high-density mounting on the package side can be achieved. As a result, it is possible to reduce the size of the package.

Figure 5:
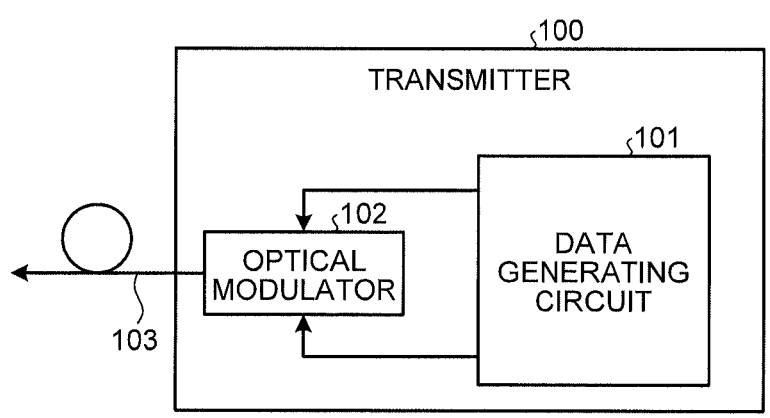
FIG. 5 is a diagram illustrating a configuration of a transmitter including an optical modulator on which the printed circuit board according to the present embodiment is mounted.

An optical modulator using the above-described PCB 10 can satisfy both the reduction of crosstalk and the excellent mountability, so the optical modulator is suited to be applied, for example, to a transmitter. FIG. 5 is a diagram illustrating a configuration of a transmitter 100 including an optical modulator 102. As illustrated in FIG. 5, the transmitter 100 includes a data generating circuit 101, the optical modulator 102, and an optical fiber 103. These components are coupled so as to input/output various signals or data unidirectionally or bi-directionally. Data generated by the data generating circuit 101 is converted from an electrical signal to an optical signal by the optical modulator 102, and then the optical signal is transmitted to outside the transmitter 100 through the optical fiber 103 as a transmission medium. The optical modulator 102 includes the PCB 10 according to the present embodiment and an optical module which modulate the signal and is mounted on the PCB 10. One example of the optical module is a Mach-Zhender interferometer module.

As explained above, the PCB 10 has the connection ground pattern 21 and the wiring ground pattern 31. The connection ground pattern 21 is an island-like pattern for soldered connection formed on an upper layer (a first wiring layer) of an insulating layer 50. The wiring ground pattern 31 is formed to be spaced from the connection ground pattern 21 on the upper layer of the insulating layer 50. The connection ground pattern 21 and the wiring ground pattern 31 are electrically coupled via the intermediate layer 70 (a second wiring layer). When the wiring ground pattern 31 is covered with the solder resist 60 or 61 or the like, even if the position of an end of the solder resist varies among wiring ground patterns 31, this has no influence on an exposed area of the connection ground pattern 21. Therefore, the area of the connection part does not vary among connection ground patterns in the PCB 10 or different PCBs. In other words, when ground patterns are spatially separated, an influence of a variation in the position of the end of the solder resist is eliminated, and the area of the connection part is fixed (stabilized). Therefore, there is no concern that a variation in connection part area may adversely affect the reliability (the fatigue resistance, the connection strength) or electrical characteristics of the connection part when the connection part is coupled to an electrode of another circuit board by soldering or the like.

Namely, conventionally, the area of the connection part varies, and this variation is caused by non-uniformity in the position of the end of the solder resist. Since the mountability and the packaging density of a ground pattern are normally in a trade-off relationship, as the ground pattern is packaged at higher density, the mountability is decreased, and the above-described non-uniformity becomes prominent. Accordingly, as in the PCB 10 according to the present embodiment, a ground pattern is separated into a connection ground pattern and a wiring ground pattern, thereby eliminating the influence of non-uniformity of the solder resist on the area of the connection part. Consequently, the mountabilities of the ground pattern and the solder resist are improved, and as a result, high-density mounting becomes possible.

Furthermore, the PCB 10 satisfies both improvement of the mountability and reduction of crosstalk. Namely, a ground pattern is separated into the connection ground pattern 21 and the wiring ground pattern 31 on the surface of the PCB 10, and the connection ground pattern 21 and the wiring ground pattern 31 are formed so that a distance between the connection ground pattern 21 and the signal pattern 41 is relatively large and a distance between the wiring ground pattern 31 and the signal pattern 41 is relatively small. In this configuration, the PCB 10 prioritizes the mountability in the connection ground pattern 21 and prioritizes reduction of crosstalk in the wiring ground pattern 31, thereby achieves not only physical separation but also functional separation. In the former case, solder bridging is less likely to occur between the connection ground pattern 21 and the signal pattern 41, and therefore, the mountability is improved, and high-density mounting becomes possible. On the other hand, crosstalk is more likely to occur; however, an influence of this is small because the distance of the signal pattern 41 on the side of the connection part is quite shorter than the distance of the signal pattern 41 on the side of the non-connection part (the line). In the latter case, the distance between the wiring ground pattern 31 and the signal pattern 41 is small, so there is less crosstalk, and a good impedance is maintained. On the other hand, there is concern for the occurrence of bridging; however, the wiring ground pattern 31 is covered with the solder resist 60, so the occurrence of bridging can be avoided.

Especially, the PCB 10 further has the solder resist 60, which is formed so that the connection ground pattern 21 is exposed, above the first wiring layer. Accordingly, solder used in connection of the connection ground pattern 21 is prevented from flowing into the side of the wiring ground pattern 31, that is, formation of a bridge is prevented. Therefore, it is possible to prevent a short circuit from occurring between the connection ground pattern 21 and the wiring ground pattern 31. As a result, the resistance and reliability of the PCB 10 in the manufacturing process are improved.

Incidentally, in the present embodiment, there is described a method to uniformize the area of the connection part by taking the example of soldered connection between the PCB and the FPC. However, the present embodiment is not limited to this, and the same effect can also be achieved, for example, in soldered connection between PCBs and soldered connection between FPCs. Furthermore, in the present embodiment, application to the optical modulator 102 is taken as an example; however, the present embodiment is not limited to this, and can be applied to any other devices having a circuit board to be coupled to another circuit board.

Moreover, the wiring ground pattern 31 does not necessarily have to be covered with the solder resist 60. Namely, if solder can be certainly prevented from flowing from the connection part into the non-connection part by an appropriate distance between the connection ground pattern 21 and the wiring ground pattern 31 or reduction of the width of the connection ground pattern 21, etc., a configuration of the PCB 10 having no solder resist 60 can be employed. This configuration allows the manufacturer to skip the step of covering the PCB 10 with the solder resist 60, and the manufacturing process can be simplified. As a result, it is possible to perform connection of a ground pattern easily and quickly.

According to an aspect of a circuit board disclosed in the present application, it is possible to suppress a variation in connection part area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A circuit board comprising:
a first pattern that is formed on a first wiring layer; and
a second pattern that is formed to be spaced from the first pattern on the first wiring layer, and is electrically coupled to the first pattern via a second wiring layer, wherein
the first pattern is a connection ground pattern formed for soldered connection and
the second pattern is a wiring ground pattern formed for reduction of crosstalk on the circuit board, wherein
the circuit board is a surface-mount technology (SMT)-based printed circuit board (PCB) in which an electrode of another circuit board is directly soldered onto the surface of the circuit board to facilitate mounting of a ground electrode,
the first pattern is a ground electrode that is an island-like pattern formed for soldered connection to a flexible printed circuit (FPC), and
the second pattern is a ground wiring line that is a pattern formed for reduction of crosstalk on the surface-mount technology-based printed circuit board, wherein
a pitch between two signal patterns composing a channel in the flexible printed circuit becomes gradually narrower toward a direction of signal transmission, and an end side pitch between the two signal patterns formed on the flexible printed circuit is smaller than an end side pitch between two signal patterns formed on the printed circuit board, wherein
the first and second patterns are ground patterns,
the circuit board further comprises a signal pattern that is formed parallel with the second pattern on the first wiring layer, and
a distance between the first pattern and the signal pattern is larger than a distance between the second pattern and the signal pattern, wherein
the width of the signal pattern on the side of the first pattern is larger than the width of the signal pattern on the side of the second pattern, wherein
the first pattern and the second pattern are coupled to an intermediate layer via through-holes, and the two signal patterns are not coupled to the intermediate layer via the through-holes, and
connection between the surface of the circuit board and the intermediate layer is limited to the ground patterns only, and the two signal patterns are formed exclusively on the surface of the circuit board without making through-holes connecting to the intermediate layer.

2. The circuit board according to claim 1, further comprising an insulating layer that is formed above the first wiring layer so that the first pattern is exposed.

3. An optical modulator comprising:
an optical module; and
a circuit board that is electrically coupled to the optical module, wherein
the circuit board includes:
a first pattern that is formed on a first wiring layer; and
a second pattern that is formed to be spaced from the first pattern on the first wiring layer, and is electrically coupled to the first pattern via a second wiring layer, wherein
the first pattern is a connection ground pattern formed for soldered connection and
the second pattern is a wiring ground pattern formed for reduction of crosstalk on the circuit board, wherein
the circuit board is a surface-mount technology (SMT)-based printed circuit board (PCB) in which an electrode of another circuit board is directly soldered onto the surface of the circuit board to facilitate mounting of a ground electrode,
the first pattern is a ground electrode that is an island-like pattern formed for soldered connection to a flexible printed circuit (FPC), and
the second pattern is a ground wiring line that is a pattern formed for reduction of crosstalk on the surface-mount technology-based printed circuit board, wherein
a pitch between two signal patterns composing a channel in the flexible printed circuit becomes gradually narrower toward a direction of signal transmission, and an end side pitch between the two signal patterns formed on the flexible printed circuit is smaller than an end side pitch between two signal patterns formed on the printed circuit board, wherein the first and second patterns are ground patterns, the circuit board further comprises a signal pattern that is formed parallel with the second pattern on the first wiring layer, and a distance between the first pattern and the signal pattern is larger than a distance between the second pattern and the signal pattern, wherein the width of the signal pattern on the side of the first pattern is larger than the width of the signal pattern on the side of the second pattern, wherein the first pattern and the second pattern are coupled to an intermediate layer via through-holes, and the two signal patterns are not coupled to the intermediate layer via the through-holes, and connection between the surface of the circuit board and the intermediate layer is limited to the ground patterns only, and the two signal patterns are formed exclusively on the surface of the circuit board without making through-holes connecting to the intermediate layer.

* * * * *